(12) United States Patent
Suzuki et al.

(10) Patent No.: US 7,708,835 B2
(45) Date of Patent: *May 4, 2010

(54) FILM PRECURSOR TRAY FOR USE IN A FILM PRECURSOR EVAPORATION SYSTEM AND METHOD OF USING

(75) Inventors: Kenji Suzuki, Guilderland, NY (US); Emmanuel P. Guidotti, Barberaz (FR); Gerrit J. Leusink, Saltpoint, NY (US); Masamichi Hara, Clifton Park, NY (US); Daisuke Kuroiwa, Clifton Park, NY (US); Tadahiro Ishizaka, Waterlivet, NY (US)

(73) Assignee: Tokyo Electron Limited, Tokyo (JP)

( * ) Notice: Subject to any disclaimer, the term of this patent is extended or adjusted under 35 U.S.C. 154(b) by 1068 days.

This patent is subject to a terminal disclaimer.

(21) Appl. No.: 11/351,546

(22) Filed: Feb. 10, 2006

(65) Prior Publication Data
US 2006/0185598 A1 Aug. 24, 2006

Related U.S. Application Data

(63) Continuation-in-part of application No. 11/007,961, filed on Dec. 9, 2004, now Pat. No. 7,488,512, and a continuation-in-part of application No. 11/007,962, filed on Dec. 9, 2004, now Pat. No. 7,484,315, and a continuation-in-part of application No. 10/998,420, filed on Nov. 29, 2004, said application No. 11/007,961 is a continuation-in-part of application No. 10/998,420, said application No. 11/007,962 is a continuation-in-part of application No. 10/998,420.

(51) Int. Cl.
*C23C 16/00* (2006.01)
*B01D 7/00* (2006.01)

(52) U.S. Cl. ....................... 118/726; 392/389

(58) Field of Classification Search ................ 118/726; 34/209, 211, 215, 226, 380, 493, 497, 510, 34/359; 392/303, 307, 388, 389, 386, 394, 392/360; 261/125, DIG. 65; 219/420, 628; 427/248.1, 252, 250, 255.14, 255.23, 255.391, 427/255.6
See application file for complete search history.

(56) References Cited

U.S. PATENT DOCUMENTS 3,003,249 A 10/1961 Templeton (Continued)

FOREIGN PATENT DOCUMENTS

JP 05-098445 4/1993

(Continued)

OTHER PUBLICATIONS

U.S. Patent and Trademark Office, Office Action in related U.S. Appl. No. 10/998,420, dated Apr. 5, 2007, 7 pp.

(Continued)

*Primary Examiner*—Ram N Kackar
*Assistant Examiner*—Keath T Chen
(74) *Attorney, Agent, or Firm*—Wood, Herron & Evans, L.L.P.

(57) ABSTRACT

A high conductance, multi-tray film precursor evaporation system coupled with a high conductance vapor delivery system is described for increasing the deposition rate by increasing exposed surface area of film precursor. The multi-tray film precursor evaporation system includes one or more trays. Each tray is configured to support and retain film precursor in, for example, solid powder form or solid tablet form. Additionally, each tray is configured to provide for a high conductance flow of carrier gas over the film precursor while the film precursor is heated. For example, the carrier gas flows inward over the film precursor, and vertically upward through a flow channel within the stackable trays and through an outlet in the solid precursor evaporation system.

26 Claims, 10 Drawing Sheets

U.S. PATENT DOCUMENTS

| | | | |
|---|---|---|---|
| 3,801,294 A | | 4/1974 | Schultz et al. |
| 4,190,965 A | | 3/1980 | Erickson |
| 4,378,987 A | | 4/1983 | Miller et al. |
| 4,817,557 A | | 4/1989 | Diem et al. |
| 4,948,623 A | | 8/1990 | Beach et al. |
| 5,221,354 A | | 6/1993 | Rigney |
| 5,904,771 A | | 5/1999 | Tasaki et al. |
| 5,914,001 A | | 6/1999 | Hansen |
| 6,024,915 A | | 2/2000 | Kume et al. |
| 6,113,982 A | * | 9/2000 | Claar et al. ............. 427/248.1 |
| 6,203,619 B1 | | 3/2001 | McMillan |
| 6,270,839 B1 | | 8/2001 | Onoe et al. |
| 6,380,080 B2 | | 4/2002 | Visokay |
| 6,440,494 B1 | | 8/2002 | Arena-Foster |
| 6,544,345 B1 | | 4/2003 | Mayer et al. |
| 6,718,126 B2 | | 4/2004 | Lei |
| 6,897,160 B2 | | 5/2005 | Derderian et al. |
| 6,921,062 B2 | | 7/2005 | Gregg et al. |
| 7,122,085 B2 | | 10/2006 | Shero et al. |
| 7,132,128 B2 | | 11/2006 | Brcka |
| 7,273,814 B2 | | 9/2007 | Matsuda |
| 7,279,421 B2 | | 10/2007 | Suzuki |
| 2002/0013052 A1 | | 1/2002 | Visokay |
| 2002/0187632 A1 | | 12/2002 | Marsh |
| 2003/0019428 A1 | | 1/2003 | Ku et al. |
| 2003/0047141 A1 | * | 3/2003 | Warnes et al. ............... 118/726 |
| 2003/0053799 A1 | | 3/2003 | Lei |
| 2003/0111014 A1 | | 6/2003 | Donatucci et al. |
| 2003/0203617 A1 | | 10/2003 | Lane et al. |
| 2003/0211736 A1 | | 11/2003 | Ludviksson et al. |
| 2004/0016404 A1 | | 1/2004 | Gregg et al. |
| 2004/0025370 A1 | | 2/2004 | Guenther |
| 2004/0161545 A1 | | 8/2004 | Montano et al. |
| 2004/0206935 A1 | | 10/2004 | Miura et al. |
| 2005/0006799 A1 | | 1/2005 | Gregg et al. |
| 2005/0072357 A1 | | 4/2005 | Shero et al. |
| 2005/0147749 A1 | | 7/2005 | Liu et al. |
| 2006/0110530 A1 | | 5/2006 | Suzuki et al. |
| 2006/0110918 A1 | | 5/2006 | Suzuki |
| 2006/0112882 A1 | | 6/2006 | Suzuki et al. |
| 2006/0112883 A1 | | 6/2006 | Suzuki et al. |
| 2006/0115589 A1 | | 6/2006 | Vukoic |
| 2006/0115590 A1 | | 6/2006 | Suzuki et al. |
| 2006/0115593 A1 | | 6/2006 | Suzuki et al. |
| 2006/0182886 A1 | | 8/2006 | Guidotti et al. |
| 2006/0185597 A1 | | 8/2006 | Suzuki et al. |
| 2006/0211228 A1 | | 9/2006 | Matsuda |
| 2006/0219168 A1 | | 10/2006 | Brcka |
| 2006/0220248 A1 | | 10/2006 | Suzuki |
| 2006/0222769 A1 | | 10/2006 | Brcka |
| 2007/0032079 A1 | | 2/2007 | Suzuki et al. |
| 2007/0072414 A1 | | 3/2007 | Suzuki |
| 2007/0113789 A1 | | 5/2007 | Brcka |
| 2007/0170604 A1 | | 7/2007 | Soininen |
| 2007/0237895 A1 | | 10/2007 | Suzuki et al. |
| 2008/0003360 A1 | | 1/2008 | Suzuki et al. |
| 2008/0035062 A1 | | 2/2008 | Suzuki |
| 2008/0081473 A1 | | 4/2008 | Suzuki |
| 2008/0241357 A1 | | 10/2008 | Suzuki |

FOREIGN PATENT DOCUMENTS

| | | |
|---|---|---|
| JP | 06306584 | 11/1997 |
| WO | 2004010463 A2 | 1/2004 |
| WO | 2004011695 A2 | 2/2004 |
| WO | 2006/058310 A1 | 6/2006 |

OTHER PUBLICATIONS

U.S. Patent and Trademark Office, Office Action in related U.S. Appl. No. 10/998,420, dated Sep. 26, 2007, 6 pp.
U.S. Patent and Trademark Office, Advisory Action in related U.S. Appl. No. 10/998,420, dated Dec. 6, 2007, 3 pp.
U.S. Patent and Trademark Office, Office Action in related U.S. Appl. No. 10/998,420, dated Mar. 13, 2008, 6 pp.
U.S. Patent and Trademark Office, Office Action in related U.S. Appl. No. 11,007,961, dated Mar. 6, 2008, 11 pp.
U.S. Patent and Trademark Office, Office Action in related U.S. Appl. No. 11/351,539, dated Sep. 11, 2007, 8 pp.
U.S. Patent and Trademark Office, Office Action in related U.S. Appl. No. 11/351,539, dated Apr. 5, 2007, 7 pp.
European Patent Office, International Search Report and Written Opinion, May 4, 2006, 7 pp.
EPO, International Search Report and Written Opinion of the International Searching Authority, International Application No. PCT/US2007/060561, Mailed May 9, 2007, 9 pp.
U.S. Patent and Trademark Office, Office Action in related U.S. Appl. No. 11/537,575, dated May 5, 2008, 10 pp.
U.S. Patent and Trademark Office, Office Action in related U.S. Appl. No. 11/096,077, dated Feb. 8, 2008, 8 pp.
U.S. Patent and Trademark Office, Office Action in related U.S. Appl. No. 11/096,077, dated Nov. 6, 2007, 3pp.
U.S. Patent and Trademark Office, Office Action in related U.S. Appl. No. 11/096,077, dated Aug. 24, 2007, 12 pp.
U.S. Patent and Trademark Office, Office Action in related U.S. Appl. No. 11/096,077, dated Dec. 29, 2006, 11 pp.
Taiwanese IPO, Notice of Examination Opinions in related TW Application No. 94143637, dated Mar. 25, 2008, 12 pp.
U.S. Patent and Trademark Office, Office Action in related U.S. Appl. No. 11/007,962, Dated Dec. 4, 2006, 9 pp.
U.S. Patent and Trademark Office, Office Action in related U.S. Appl. No. 11/007,962, Dated May 3, 2007, 8 pp.
U.S. Patent and Trademark Office, Office Action in related U.S. Appl. No. 11/007,962, Dated Jun. 6, 2008, 11 pp.
U.S. Patent and Trademark Office, Office Action in related U.S. Appl. No. 11/007,962, Dated Jan. 9, 2008, 6 pp.
U.S. Patent and Trademark Office, Office Action in related U.S. Appl. No. 10/998,420, dated Dec. 12, 2009, 30 pp.
Chinese IPO, Office Action in CN Appl. No. 200580040912.0, dated Mar. 23, 2009, 9 pp.
U.S. Patent and Trademark Office, Office Action in related U.S. Appl. No. 10/998,420, dated Nov. 13, 2008, 11 pp.
U.S. Patent and Trademark Office, Office Action in related U.S. Appl. No. 10/998,420, dated Jul. 9, 2009, 30 pp.
U.S. Patent and Trademark Office, Office Action in related U.S. Appl. No. 11/096,077, dated Sep. 9, 2008, 10 pp.
U.S. Patent and Trademark Office, Office Action in related U.S. Appl. No. 11/096,077, dated Apr. 16, 2009, 8 pp.

* cited by examiner

FILM PRECURSOR TRAY FOR USE IN A FILM PRECURSOR EVAPORATION SYSTEM AND METHOD OF USING

This application is a Continuation-In-Part of application Ser. No. 11/007,961 now U.S. Pat. No. 7,488,512, filed on Dec. 9, 2004; U.S. Pat. No. 7,484,315 application Ser. No. 11/007,962, filed on Dec. 9, 2004; and U.S. patent application Ser. No. 10/998,420, filed on Nov. 29, 2004, all of which are hereby expressly incorporated by reference herein.

Application Ser. No. 11/007,961 now U.S. Pat. No. 7,488,512 is a Continuation-In-Part of U.S. patent application Ser. No. 10/998,420, filed on Nov. 29, 2004; and application Ser. No. 11/007,962 now U.S. Pat. No. 7,484,315 is also a Continuation-In-Part of U.S. patent application Ser. No. 10/998,420, filed on Nov. 29, 2004, all of which are hereby expressly incorporated by reference herein.

This application is also related to U.S. patent application Ser. No. 11/351,539, entitled "Film Precursor Evaporation System and Method of Using", filed on even date herewith, the entirety of which is incorporated by reference herein.

BACKGROUND OF THE INVENTION

1. Field of Invention

The present invention relates to a system for thin film deposition, and more particularly to a system for evaporating a film precursor and delivering the vapor to a deposition chamber.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperatures between about 400 degrees C. and about 500 degrees C., or lower.

For example, Cu integration schemes for technology nodes less than or equal to 130 nm currently utilize a low dielectric constant (low-k) inter-level dielectric, followed by a physical vapor deposition (PVD) TaN layer and Ta barrier layer, followed by a PVD Cu seed layer, and an electrochemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals.

SUMMARY OF THE INVENTION

In one embodiment of the present invention, a system for depositing a thin film from a film precursor is provided.

In another embodiment of the present invention, an evaporation system for a film precursor is provided.

In yet another embodiment of the present invention, a method and system for depositing a metal film from a solid metal precursor at a high rate is provided.

According to yet another embodiment, a replaceable film precursor support assembly is described, comprising a replaceable tray configured to support a film precursor, and configured to be stacked with one or more additional stackable trays in a film precursor evaporation system comprising a container having an outer wall and a bottom, and a lid configured to be sealably coupled to the container, the lid comprising an outlet configured to be sealably coupled to a thin film deposition system, wherein the replaceable tray comprises an inner edge and an outer edge configured to retain the film precursor therebetween, with one of the edges being stackable and includes one or more tray openings formed in the stackable edge and configured to flow a carrier gas from a carrier gas supply system, over the film precursor towards other edge and exhaust through the outlet in the lid with film precursor vapor.

In some embodiments of the invention, the replaceable tray comprises a stackable inner edge and an outer edge configured to retain the film precursor therebetween, and the replaceable tray includes one or more tray openings formed in the stackable inner edge, and configured to flow a carrier gas from a carrier gas supply system, over the film precursor towards a center of the container and exhaust through the outlet in the lid with film precursor vapor.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
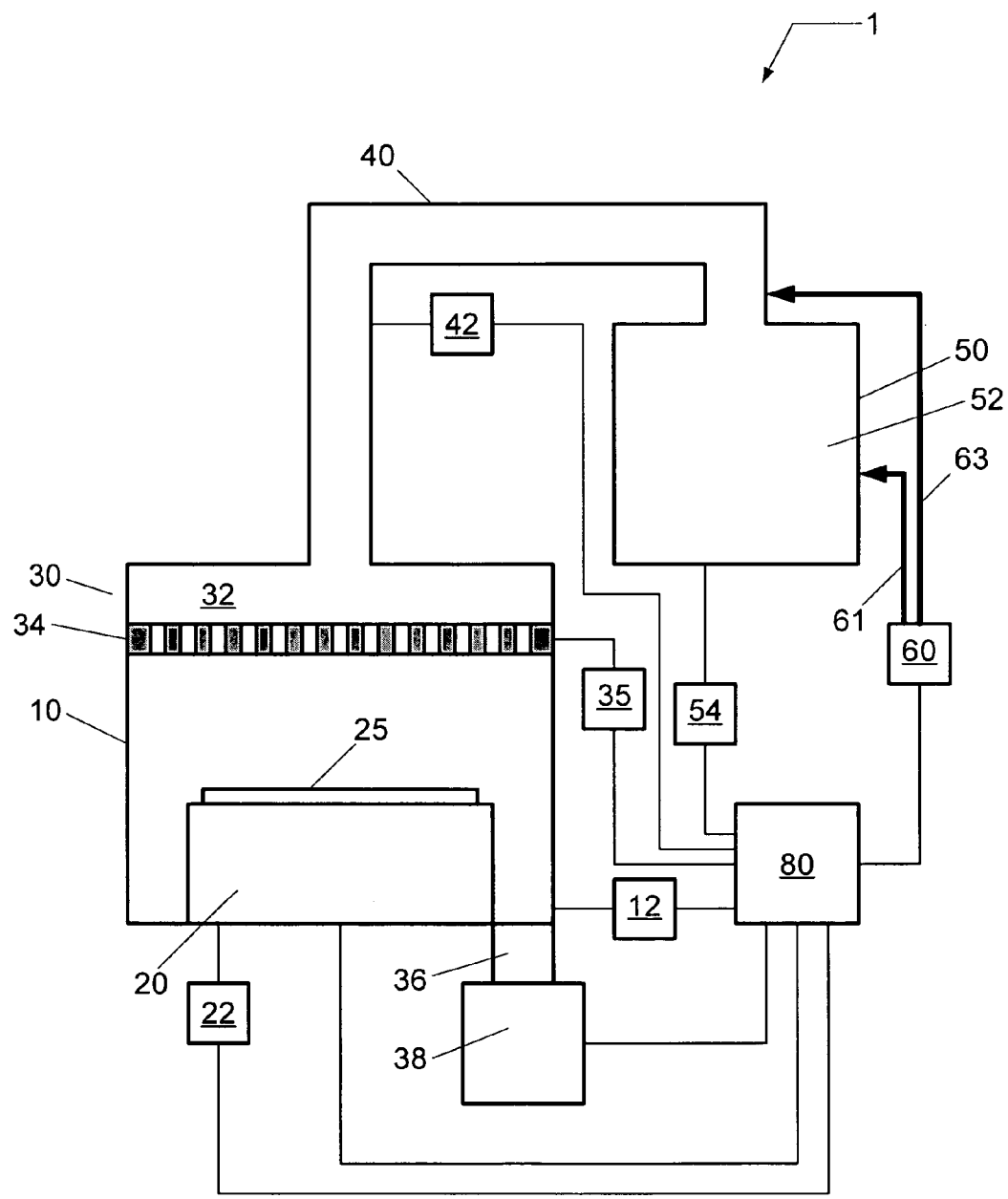
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a thin film, such as a metal film, on a substrate according to one embodiment. The deposition system 1 comprises a process chamber 10 having a substrate holder 20 configured to support a substrate 25, upon which the thin film is formed. The process chamber 10 is coupled to a film precursor evaporation system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and film precursor evaporation system 50 to a pressure suitable for forming the thin film on the Substrate 25, and suitable for evaporation of a film precursor (not shown) in the film precursor evaporation system 50.

Referring still to FIG. 1, the film precursor evaporation system 50 is configured to store a film precursor and heat the film precursor to a temperature sufficient for evaporating the film precursor, while introducing vapor phase film precursor to the vapor precursor delivery system 40. As will be discussed in more detail below with reference to FIGS. 3-9, the film precursor can, for example, comprise a solid film precursor. Additionally, for example, the film precursor can include a solid metal precursor. Additionally, for example, the film precursor can include a metal-carbonyl. For instance, the metal-carbonyl can include ruthenium carbonyl ($Ru_3(CO)_{12}$), or rhenium carbonyl ($Re_2(CO)_{10}$). Additionally, for instance, the metal-carbonyl can include $W(CO)_6$, $Mo(CO)_6$, $Co_2(CO)_8$, $Rh_4(CO)_{12}$, $Cr(CO)_6$, or $Os_3(CO)_{12}$. Additionally, for example, when depositing tantalum (Ta), the film precursor can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or $Ta(EtCp)_2(CO)H$. Additionally, for example, when depositing titanium (Ti), the film precursor can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT). Additionally, for example, when depositing ruthenium (Ru), the film precursor can include $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$.

In order to achieve the desired temperature for evaporating the film precursor (or subliming a solid metal precursor), the film precursor evaporation system 50 is coupled to an evaporation temperature control system 54 configured to control the evaporation temperature. For instance, the temperature of the film precursor is generally elevated to approximately 40 degrees C. or greater in conventional systems in order to sublime or evaporate the film precursor. As the film precursor is heated to cause evaporation (or sublimation), a carrier gas is passed over the film precursor or by the film precursor. The carrier gas can include, for example, an inert gas, such as a noble gas (i.e., He, Ne, Ar, Kr, Xe), or a monoxide, such as carbon monoxide (CO), for use with metal-carbonyls, or a mixture thereof. For example, a carrier gas supply system 60 is coupled to the film precursor evaporation system 50, and it is configured to, for instance, supply the carrier gas above the film precursor via feed line 61. In another example, carrier gas supply system 60 is coupled to the vapor precursor delivery system 40 and is configured to supply the carrier gas to the vapor of the film precursor via feed line 63 as or after it enters the vapor precursor delivery system 40. Although not shown, the carrier gas supply system 60 can comprise a gas source, one or more control valves, one or more filters, and a mass flow controller. For instance, the flow rate of carrier gas can range from approximately 5 sccm (standard cubic centimeters per minute) to approximately 1000 sccm. For example, the flow rate of carrier gas can range from about 10 sccm to about 200 sccm. By way of further example, the flow rate of carrier gas can range from about 20 sccm to about 100 sccm.

Downstream from the film precursor evaporation system 50, the film precursor vapor flows with the carrier gas through the vapor precursor delivery system 40 until it enters a vapor distribution system 30 coupled to the process chamber 10. The vapor precursor delivery system 40 can be coupled to a vapor line temperature control system 42 in order to control the vapor line temperature, and prevent decomposition of the film precursor vapor as well as condensation of the film precursor vapor. For example, the vapor line temperature can be set to a value approximately equal to or greater than the evaporation temperature. Additionally, for example, the vapor precursor delivery system 40 can be characterized by a high conductance in excess of about 50 liters/second.

Referring again to FIG. 1, the vapor distribution system 30, coupled to the process chamber 10, comprises a plenum 32 within which the vapor disperses prior to passing through a vapor distribution plate 34 and entering a processing zone above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

Once film precursor vapor enters the processing zone 33, the film precursor vapor thermally decomposes upon adsorption at the substrate surface due to the elevated temperature of the substrate 25, and the thin film is formed on the substrate 25. The substrate holder 20 is configured to elevate the temperature of substrate 25, by virtue of the substrate holder 20 being coupled to a substrate temperature control system 22. For example, the substrate temperature control system 22 can be configured to elevate the temperature of substrate 25 up to approximately 500 degrees C. In one embodiment, the substrate temperature can range from about 100 degrees C. to about 500 degrees C. In another embodiment, the substrate temperature can range from about 300 degrees C. to about 400 degrees C. Additionally, the process chamber 10 can be coupled to a chamber temperature control system 12 configured to control the temperature of the chamber walls.

As described above, for example, conventional systems have contemplated operating the film precursor evaporation system 50, as well as the vapor precursor delivery system 40, at a temperature greater than or equal to approximately 40 degrees C. in order to limit metal vapor precursor decomposition, and metal vapor precursor condensation.

It may also be desirable to periodically clean deposition system 1 following processing of one or more substrates. For example, additional details on a cleaning method and system can be obtained from co-pending U.S. patent application Ser. No. 10/998,394, filed on Nov. 29, 2004 and entitled "Method and System for Performing In-situ Cleaning of a Deposition System", which is herein incorporated by reference in its entirety.

As discussed above, the deposition rate is proportional to the amount of film precursor that is evaporated and transported to the substrate prior to decomposition, or condensation, or both. Therefore, in order to achieve a desired deposition rate, and to maintain consistent processing performance (i.e., deposition rate, film thickness, film uniformity, film morphology, etc.) from one substrate to the next, it is important to provide the ability to monitor, adjust, or control the flow rate of the film precursor vapor. In conventional systems, an operator may indirectly determine the flow rate of film precursor vapor by using the evaporation temperature, and a pre-determined relationship between the evaporation temperature and the flow rate. However, processes and their performance drift in time, and hence it is imperative that the flow rate is measured more accurately. For example, additional details can be obtained from co-pending U.S. patent application Ser. No. 10/998,393, filed on Nov. 29, 2004 and entitled "Method and System for Measuring a Flow Rate in a Solid Precursor Delivery System", which is herein incorporated by reference in its entirety.

Still referring the FIG. 1, the deposition system 1 can further include a control system 80 configured to operate, and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the film precursor evaporation system 50, and the carrier gas supply system 60.

Figure 2:
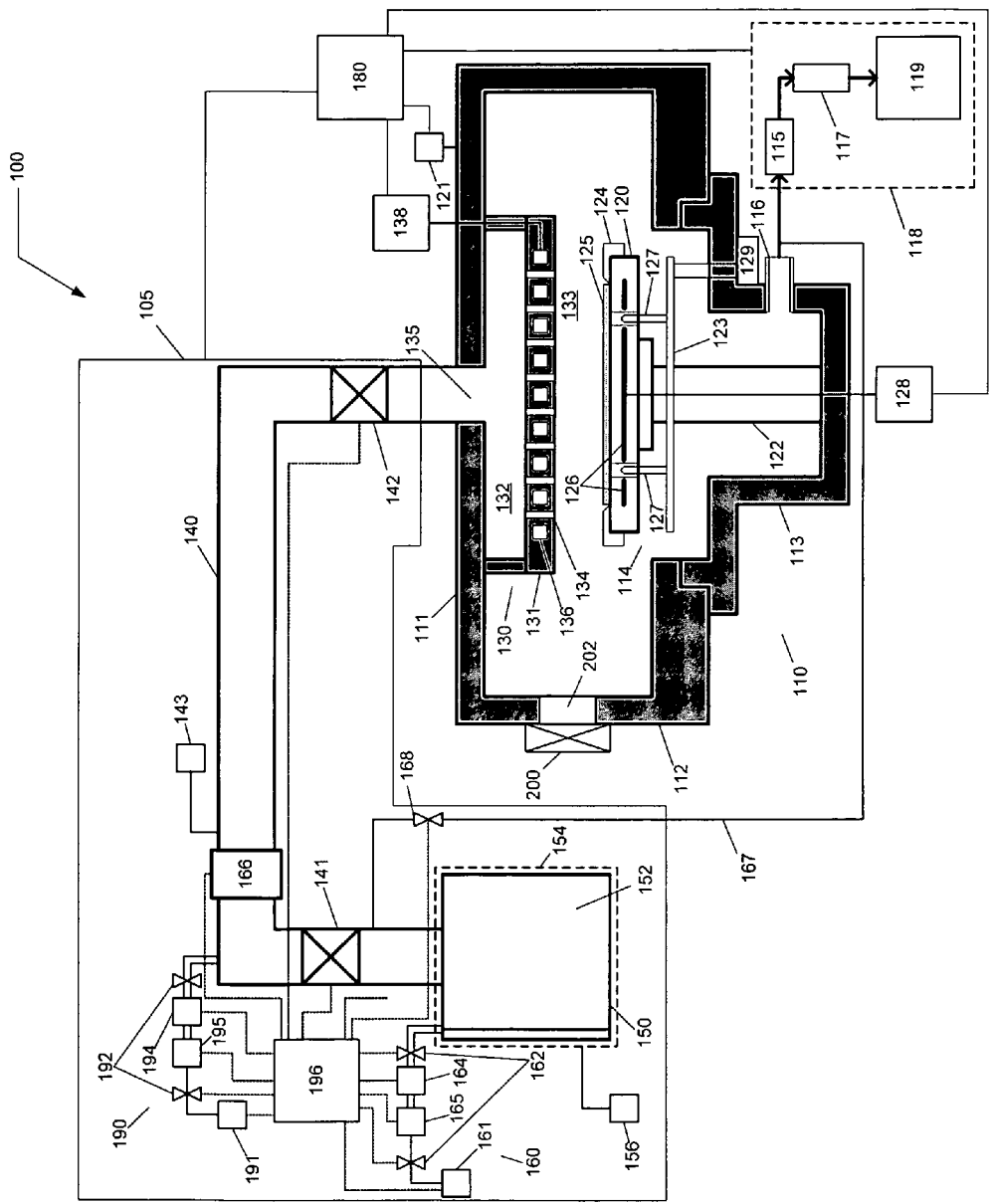
FIG. 2 depicts a schematic view of a deposition system according to another embodiment of the invention.

In yet another embodiment, FIG. 2 illustrates a deposition system 100 for depositing a thin film, such as a metal film, on a substrate. The deposition system 100 comprises a process chamber having a substrate holder 120 configured to support a substrate 125, upon which the thin film is formed. The process chamber 110 is coupled to a precursor delivery system 105 having film precursor evaporation system 150 configured to store and evaporate a film precursor (not shown), and a vapor precursor delivery system 140 configured to transport film precursor vapor.

The process chamber 110 comprises an upper chamber section 111, a lower chamber section 112, and an exhaust chamber 113. An opening 114 is formed within lower chamber section 112, where bottom section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional guide ring 124 for positioning the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature, or the substrate holder temperature, or both, and a controller configured to perform at least one of monitoring, adjusting, or controlling the temperature of the substrate or substrate holder.

During processing, the heated substrate 125 can thermally decompose the vapor of film precursor vapor, such as a metal-containing film precursor, and enable deposition of a thin film, such as a metal layer, on the substrate 125. According to one embodiment, the film precursor includes a solid precursor. According to another embodiment, the film precursor includes a metal precursor. According to another embodiment, the film precursor includes a solid metal precursor. According to yet another embodiment, the film precursor includes a metal-carbonyl precursor. According to yet another embodiment, the film precursor can be a ruthenium-carbonyl precursor, for example $Ru_3(CO)_{12}$. According to yet another embodiment of the invention, the film precursor can be a rhenium carbonyl precursor, for example $Re_2(CO)_{10}$. As will be appreciated by those skilled in the art of thermal chemical vapor deposition, other ruthenium carbonyl precursors and rhenium carbonyl precursors can be used without departing from the scope of the invention. In yet another embodiment, the film precursor can be $W(CO)_6$, $Mo(CO)_6$, $Co_2(CO)_8$, $Rh_4(CO)_{12}$, $Cr(CO)_6$, or $Os_3(CO)_{12}$. Additionally, for example, when depositing tantalum (Ta), the film precursor can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or $Ta(EtCp)_2(CO)H$. Additionally, for example, when depositing titanium (Ti), the film precursor can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT). Additionally, for example, when depositing ruthenium (Ru), the film precursor can include $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$.

The substrate holder 120 is heated to a pre-determined temperature that is suitable for depositing, for instance, a desired metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of the process chamber 110 from about 40 degrees C. to about 100 degrees C., for example from about 40 degrees C. to about 80 degrees C. A pressure gauge (not shown) is used to measure the process chamber pressure.

Also shown in FIG. 2, a vapor distribution system 130 is coupled to the upper chamber section 111 of process chamber 110. The vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a vapor precursor from the vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition of the film precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20 degrees C. to about 100 degrees C.

Film precursor evaporation system 150 is configured to hold a film precursor, and evaporate (or sublime) the film precursor by elevating the temperature of the film precursor. A precursor heater 154 is provided for heating the film precursor to maintain the film precursor at a temperature that produces a desired vapor pressure of film precursor. The precursor heater 154 is coupled to an evaporation temperature control system 156 configured to control the temperature of the film precursor. For example, the precursor heater 154 can be configured to adjust the temperature of the film precursor (or evaporation temperature) to be greater than or equal to approximately 40 degrees C. Alternatively, the evaporation temperature is elevated to be greater than or equal to approximately 50 degrees C. For example, the evaporation temperature is elevated to be greater than or equal to approximately 60 degrees C. In one embodiment, the evaporation temperature is elevated to range from approximately 60 to 100 degrees C., and in another embodiment, to range from approximately 60 to 90 degrees C. Additionally, precursor heaters may be provided in each of the trays. Such heaters can, for example, be of the resistance heating type.

As the film precursor is heated to cause evaporation (or sublimation), a carrier gas can be passed over the film precursor, or by the film precursor. The carrier gas can include, for example, an inert gas, such as a noble gas (i.e., He, Ne, Ar, Kr, Xe), or a monoxide, such as carbon monoxide (CO), for use with metal-carbonyls, or a mixture thereof. For example, a carrier gas supply system 160 is coupled to the film precursor evaporation system 150, and it is configured to, for instance, supply the carrier gas above the film precursor. Although not shown in FIG. 2, carrier gas supply system 160 can also be coupled to the vapor precursor delivery system 140 to supply the carrier gas to the vapor of the film precursor as or after it enters the vapor precursor delivery system 140. The carrier gas supply system 160 can comprise a gas source 161, one or more control valves 162, one or more filters 164, and a mass flow controller 165. For instance, the flow rate of carrier gas can range from approximately 5 sccm (standard cubic centimeters per minute) to approximately 1000 sccm. In one embodiment, for instance, the flow rate of carrier gas can range from about 10 sccm to about 200 sccm. In another embodiment, for instance, the flow rate of carrier gas can range from about 20 sccm to about 100 sccm.

Additionally, a sensor 166 is provided for measuring the total gas flow from the film precursor evaporation system 150. The sensor 166 can, for example, comprise a mass flow controller, and the amount of film precursor delivered to the process chamber 110, can be determined using sensor 166 and mass flow controller 165. Alternately, the sensor 166 can comprise a light absorption sensor to measure the concentration of the film precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the film precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142 respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the film precursor in the vapor line. The temperature of the vapor lines can be controlled from about 20 degrees C. to about 100 degrees C., or from about 40 degrees C. to about 90 degrees C. For example, the vapor line temperature can be set to a value approximately equal to or greater than the evaporation temperature.

Moreover, dilution gases can be supplied from a dilution gas supply system 190. The dilution gas can include, for example, an inert gas, such as a noble gas (i.e., He, Ne, Ar, Kr, Xe), or a monoxide, such as carbon monoxide (CO), for use with metal-carbonyls, or a mixture thereof. For example, the dilution gas supply system 190 is coupled to the vapor precursor delivery system 140, and it is configured to, for instance, supply the dilution gas to vapor film precursor. The dilution gas supply system 190 can comprise a gas source 191, one or more control valves 192, one or more filters 194, and a mass flow controller 195. For instance, the flow rate of carrier gas can range from approximately 5 sccm (standard cubic centimeters per minute) to approximately 1000 sccm.

Mass flow controllers 165 and 195, and valves 162, 192, 168, 141, and 142 are controlled by a controller 196, which controls the supply, shutoff, and the flow of the carrier gas, the film precursor vapor, and the dilution gas. The sensor 166 is also connected to the controller 196 and, based on output of the sensor 166, the controller 196 can control the carrier gas flow through mass flow controller 165 to obtain the desired film precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 5000 liters per second (and greater). Alternately, the vacuum pump 119 can include a dry roughing pump. During processing, the carrier gas, dilution gas, or film precursor vapor, or any combination thereof, can be introduced into the process chamber 110, and the chamber pressure can be adjusted by the APC 115. For example, the chamber pressure can range from approximately 1 mTorr to approximately 500 mtorr, and in a further example, the chamber pressure can range from about 5 mTorr to 50 mTorr. The APC 115 can comprise a butterfly-type valve, or a gate valve. The trap 117 can collect unreacted precursor material, and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to a plate 123, and can be lowered to below the upper surface of the substrate holder 120. A drive mechanism 129 utilizing, for example, an air cylinder, provides means for raising and lowering the plate 123. The substrate 125 can be transferred into and out of process chamber 110 through gate valve 200, and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 142, and evaporation temperature control system 156; vapor distribution temperature control system 138; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610, available from Dell Corporation, Dallas, Tex. The controller 180 may also be implemented as a general-purpose computer, digital signal processor, etc.

However, the controller 180 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100 via an internet or intranet. Thus, the controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access the controller 180 to exchange data via at least one of a direct connection, an intranet, or the internet.

Figure 3:
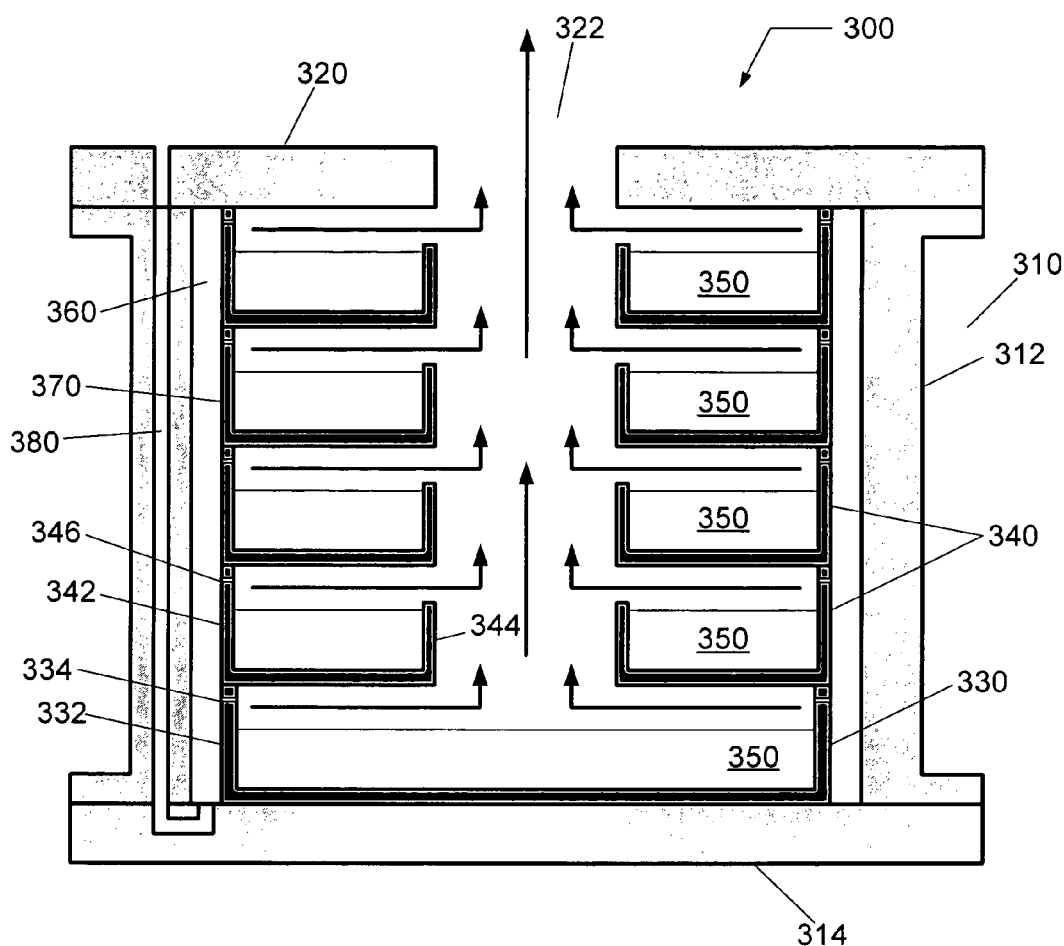
FIG. 3 presents in cross-sectional view a film precursor evaporation system according to an embodiment of the invention.

Referring now to FIG. 3, a film precursor evaporation system 300 is depicted in cross-sectional view according to an embodiment. The film precursor evaporation system 300 comprises a container 310 having an outer wall 312 and a bottom 314. Additionally, the film precursor evaporation system 300 comprises a lid 320 configured to be sealably coupled to the container 310, wherein the lid 320 includes an outlet 322 configured to be sealably coupled to a thin film deposition system, such as the one depicted in FIG. 1 or 2. The container 310 and lid 320 form a sealed environment when coupled to the thin film deposition system. The container 310 and lid 320 can, for example, be fabricated from A6061 aluminum, and may or may not include a coating applied thereon.

Furthermore, the container 310 is configured to be coupled to a heater (not shown) in order to elevate the evaporation temperature of the film precursor evaporation system 300, and to a temperature control system (not shown) in order to perform at least one of monitoring, adjusting, or controlling the evaporation temperature. When the evaporation temperature is elevated to an appropriate value as described earlier, film precursor evaporates (or sublimes) forming film precursor vapor to be transported through the vapor delivery system to the thin film deposition system. The container 310 is also sealably coupled to a carrier gas supply system (not shown), wherein the container 310 is configured to receive a carrier gas for transporting the film precursor vapor.

Figure 4:
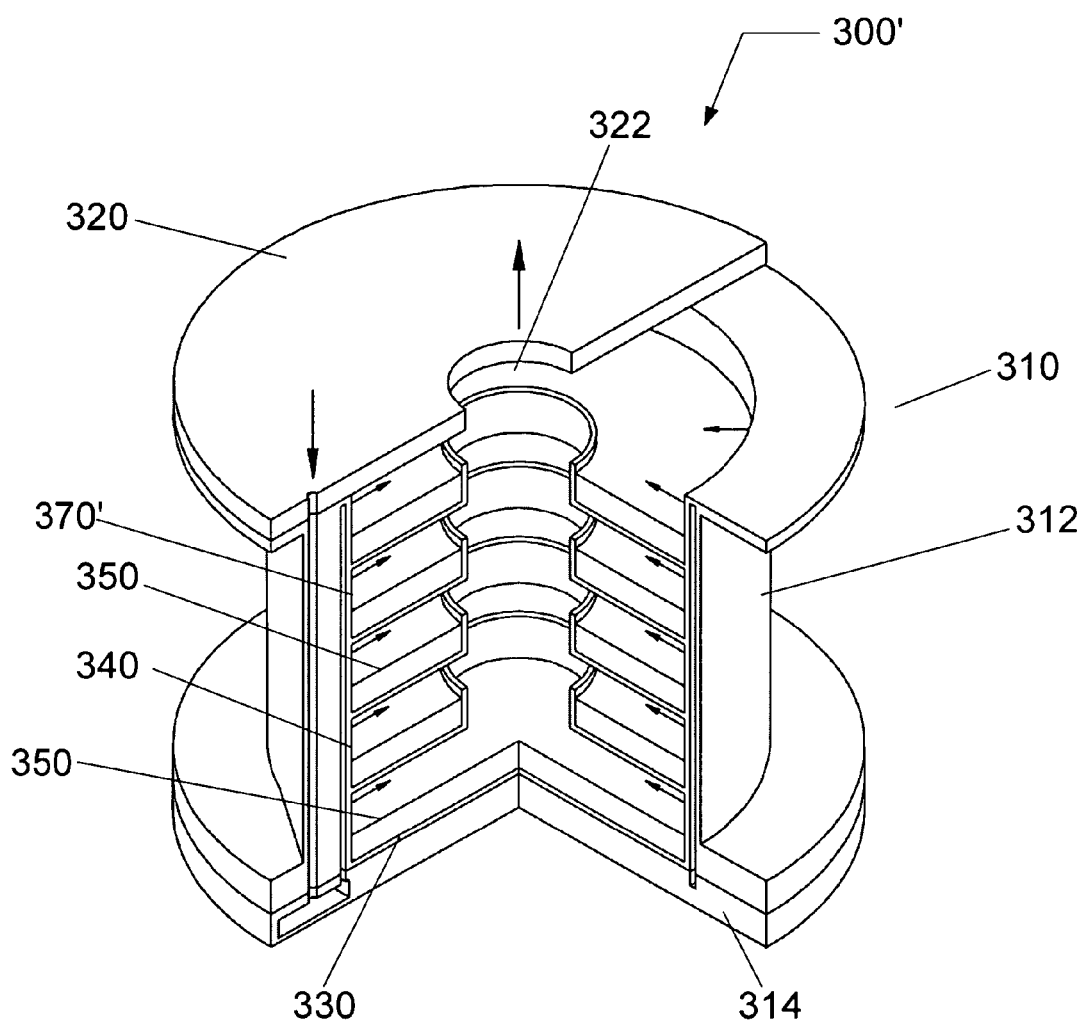
FIG. 4 presents in perspective view a film precursor evaporation system according to another embodiment of the invention.

Referring still to FIG. 3, and also to FIG. 4, the film precursor evaporation system 300 further comprises a base tray 330 configured to rest on the bottom 314 of the container 310, and having a base outer wall 332 configured to retain the film precursor 350 on the base tray 330. The base outer wall 332 includes a base support edge for supporting upper trays thereon, as discussed below. Furthermore, the base outer wall 332 includes one or more base tray openings 334 configured to flow the carrier gas from the carrier gas supply system (not shown), over the film precursor 350 towards a center of the container 310, and along an evaporation exhaust space, such as a central flow channel 318, to exhaust through the outlet 322 in the lid 320 with film precursor vapor. Consequently, the film precursor level in the base tray 330 should be below the position of the base tray openings 334.

Figure 5A:
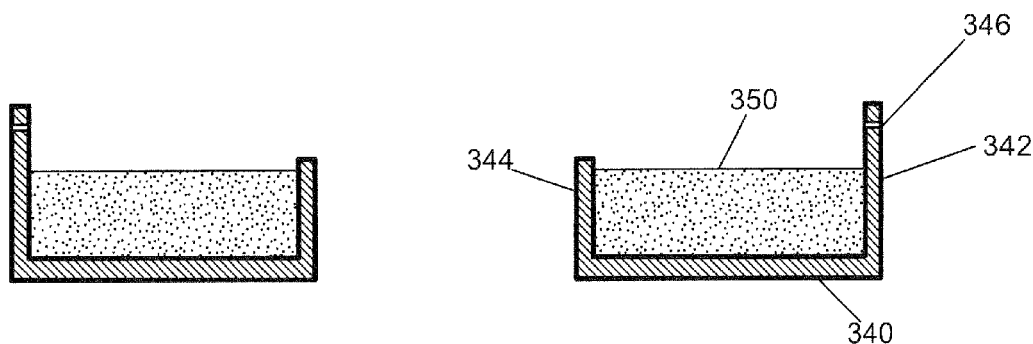
FIG. 5A presents in cross-sectional view a stackable upper tray for use in a film precursor evaporation system according to an embodiment of the invention.
Figure 5B:
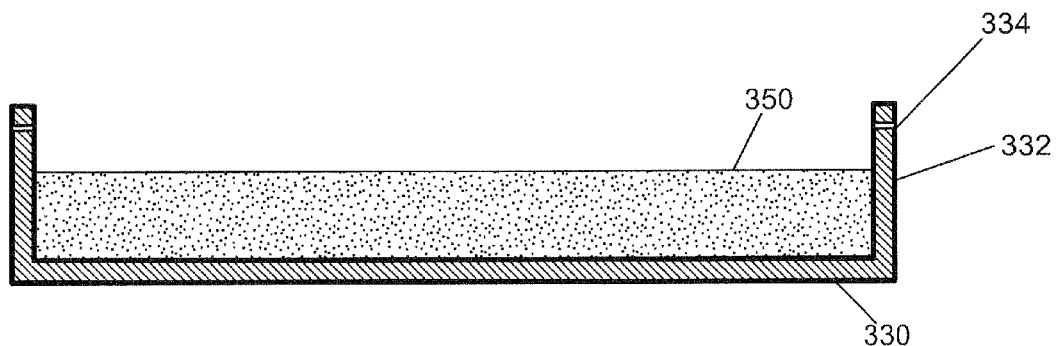
FIG. 5B presents in cross-sectional view a bottom tray for use in a film precursor evaporation system according to an embodiment of the invention.

Referring still to FIG. 3, and also to FIGS. 5A and 5B, the film precursor evaporation system 300 further comprises one or more stackable upper trays 340 configured to support the film precursor 350, and configured to be positioned or stacked upon at least one of the base tray 330 or another of the stackable upper trays 340. Each of the stackable upper trays 340 comprises an upper outer wall 342 and an inner wall 344 configured to retain the film precursor 350 therebetween. The inner walls 344 define the central flow channel 318. The upper outer wall 342 further includes an upper support edge 333 for supporting an additional upper tray 340. Thus, a first upper tray 340 is positioned to be supported on the base support edge 333 of base tray 330, and if desired, one or more additional upper trays may be positioned to be supported on the upper support edge 343 of a preceding upper tray 340. The upper outer wall 342 of each upper tray 340 includes one or more upper tray openings 346 configured to flow the carrier gas from the carrier gas supply system (not shown), over the film precursor 350 towards central flow channel 318 of the container 310, and exhaust through the outlet 322 in the lid 320 with film precursor vapor. Consequently, inner walls 344 should be shorter than upper outer walls 342 to allow the carrier gas to flow substantially radially to the central flow channel 318. Additionally, the film precursor level in each upper tray 340 should be at or below the height of the inner walls 342, and below the position of the upper tray openings 346.

The base tray 330 and the stackable upper trays 340 are depicted to be cylindrical in shape. However, the shape can vary. For instance, the shape of the trays can be rectangular, square or oval. Similarly, the inner walls 344, and thus central upper flow channel 318, can be differently shaped.

When one or more stackable upper trays 340 are stacked upon the base tray 330, a stack 370 is formed, which provides for a carrier gas supply space in the form of a peripheral channel, such as an annular space 360, between the base outer wall 332 of the base tray 330 and the container outer wall 312, and between the upper outer walls 342 of the one or more stackable upper trays 340 and the container outer wall 312. The container 310 can further comprise one or more spacers (not shown) configured to space the base outer wall 332 of the base tray 330 and the upper outer walls 342 of the one or more stackable upper trays 340 from the container outer wall 312, and thereby ensure equal spacing within the annular space 360. To state it another way, in one embodiment, the container 310 is configured such that the base outer wall 332 and the upper outer walls 342 are in vertical alignment. Additionally, the container 310 can comprise one or more thermal contact members (not shown) configured to provide mechanical contact between the inner wall of the container 310 and the outer wall of each tray, thereby assisting the conduction of thermal energy from the wall of the container 310 to each respective tray.

A sealing device, such as an O-ring, may be located between each tray and the adjacent tray or trays in order to provide a vacuum seal between one tray and the next. For example, the sealing device can be retained in a receiving groove (not shown) formed in the upper support edge 343 of upper outer wall(s) 342 and the base support edge 333 of base outer wall 332. Therefore, once the trays are installed in container 310, the coupling of lid 320 to container 310 can facilitate compression of each sealing device. The sealing device can, for example, include an elastomer O-ring. Additionally, the sealing device can, for example, include a VITON O-ring.

The number of trays, including both the base tray and the stackable upper trays, can range from two (2) to twenty (20) and, for example in one embodiment, the number of trays can be five (5), as shown in FIG. 3. In an exemplary embodiment, the stack 370 includes a base tray 330 and at least one upper tray 340 supported by the base tray 330. The base tray 330 may be as shown in FIGS. 3 and 4, or may have the same configuration as the upper trays 340 as they are shown in FIGS. 3-5B. In other words, the base tray 330 may have an inner wall. Although, in FIGS. 3-5B, the stack 370 is shown to comprise a base tray 330 with one or more separatable and stackable upper trays 340, a system 300' may include a container 310' with a stack 370' that comprises a single unitary piece having a base tray 330 integral with one or more upper trays 340, as shown in FIG. 6, such that the base outer wall 332 and upper outer walls 342 are integral. Integral is understood to include a monolithic structure, such as an integrally molded structure having no discernible boundaries between trays, as well as a permanently adhesively or mechanically joined structure where there is permanent joinder between the trays. Separatable is understood to include no joinder between trays or temporary joinder, whether adhesive or mechanical.

The base tray 330 and each of the upper trays 340, whether stackable or integral, are configured to support a film precursor 350. According to one embodiment, the film precursor 350 includes a solid precursor. According to another embodiment, the film precursor 350 includes a liquid precursor. According to another embodiment, the film precursor 350 includes a metal precursor. According to another embodiment, the film precursor 350 includes a solid metal precursor. According to yet another embodiment, the film precursor 350 includes a metal-carbonyl precursor. According to yet another embodiment, the film precursor 350 can be a ruthenium-carbonyl precursor, for example $Ru_3(CO)_{12}$. According to yet another embodiment of the invention, the film precursor 350 can be a rhenium carbonyl precursor, for example $Re_2(CO)_{10}$. In yet another embodiment, the film precursor 350 can be $W(CO)_6$, $Mo(CO)_6$, $Co_2(CO)_8$, $Rh_4(CO)_{12}$, $Cr(CO)_6$, or $Os_3(CO)_{12}$. Additionally, according to yet another embodiment, when depositing tantalum (Ta), the film precursor 350 can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or $Ta(EtCp)_2(CO)H$. Additionally, according to yet another embodiment, when depositing titanium (Ti), the film precursor 350 can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT). Additionally, according to yet another embodiment, when depositing ruthenium (Ru), the film precursor 350 can include $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$.

As described above, the film precursor 350 can include a solid precursor. The solid precursor can take the form of a solid powder, or it may take the form of one or more solid tablets. For example, the one or more solid tablets can be prepared by a number of processes, including a sintering process, a stamping process, a dipping process, or a spin-on process, or any combination thereof. Additionally, the solid precursor in solid tablet form may or may not adhere to the base tray 330 or upper tray 340. For example, a refractory metal powder may be sintered in a sintering furnace configured for both vacuum and inert gas atmospheres, and temperature up to 2000° C. and 2500° C. Alternatively, for example, a refractory metal powder can be dispersed in a fluid medium, dispensed on a tray, and distributed evenly over the tray surfaces using a spin coating process. The refractory metal spin coat may then be thermally cured.

As described earlier, carrier gas is supplied to the container 310 from a carrier gas supply system (not shown). As shown in FIGS. 3 and 6, the carrier gas may be coupled to the container 310 through the lid 320 via a gas supply line (not shown) sealably coupled to the lid 320. The gas supply line feeds a gas channel 380 that extends downward through the outer wall 312 of container 310, passes through the bottom 314 of container 310 and opens to the annular space 360.

Figure 7:
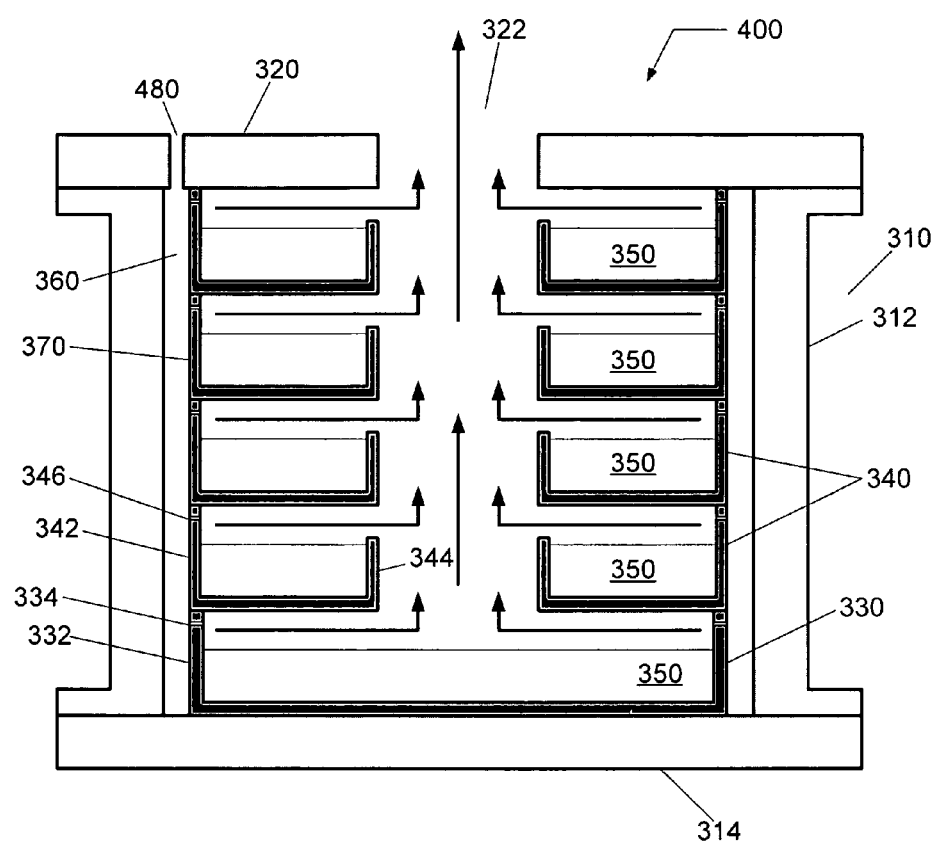
FIG. 7 presents in cross-sectional view a film precursor evaporation system according to another embodiment of the invention.
Figure 8:
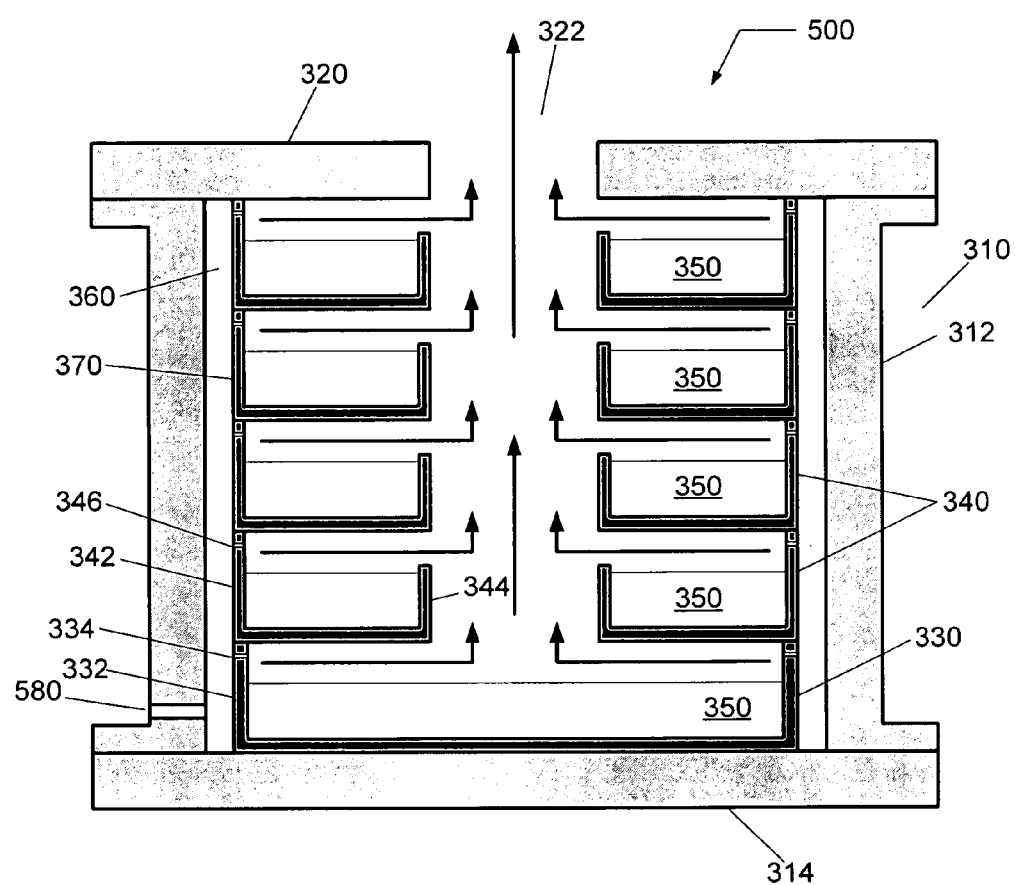
FIG. 8 presents in cross-sectional view a film precursor evaporation system according to another embodiment of the invention.

Alternatively, as shown in FIG. 7, the carrier gas may be coupled to the container 310 of the film precursor evaporation system 400 through the opening 480 in lid 320, and directly supply gas to the annular space 360. Alternatively, as shown in FIG. 8, the carrier gas may be coupled to the container 310 of the film precursor evaporation system 500 through an opening 580 in the outer wall 312, and directly supply gas to the annular space 360.

Referring again to FIG. 3, the inner diameter of the container outer wall 312 can, for example, range from approximately 10 cm to approximately 100 cm and, for example, can range from approximately 15 cm to approximately 40 cm. For instance, the inner diameter of outer wall 312 can be 20 cm. The diameter of the outlet 322 and the inner diameter of the inner walls 344 of the upper trays 340 can, for example, range from approximately 1 cm to 30 cm and, additionally, for example, the outlet diameter and inner wall diameter can range from approximately 5 to approximately 20 cm. For instance, the outlet diameter can be 10 cm. Additionally, the outer diameter of the base tray 330 and each of the upper trays 340 can range from approximately 75% to approximately 99% of the inner diameter of the outer wall 312 of container 310 and, for example, the tray diameter can range from approximately 85% to 99% of the inner diameter of the outer wall 312 of container 310. For instance, the tray diameter can be 19.75 cm. Additionally, the height of the base outer wall 332 of base tray 330 and of the upper outer wall 342 of each of the upper trays 340 can range from approximately 5 mm to approximately 50 mm and, for example, the height of each is approximately 30 mm. In addition, the height of each inner wall 344 can range from approximately 10% to approximately 90% of the height of the upper outer wall 342. For example, the height of each inner wall can range from approximately 2 mm to approximately 45 mm and, for example, can range from approximately 10 mm to approximately 20 mm. For example, the height of each inner wall is approximately 12 mm.

Referring yet again to FIG. 3, the one or more base tray openings 334 and the one or more upper tray openings 346 can include one or more slots. Alternatively, the one or more base tray openings 334 and the one or more upper tray openings 346 can include one or more orifices. The diameter of each orifice can, for example, range from approximately 0.4 mm to approximately 2 mm. For example, the diameter of each orifice can be approximately 1 mm. In one embodiment, the orifice diameter and width of the annular space 360 are chosen such that the conductance through the annular space 360 is sufficiently larger than the net conductance of the orifices in order to maintain substantially uniform distribution of the carrier gas throughout the annular space 360. When the conductance through annular space 360 is sufficiently larger than the net conductance of the orifices, then carrier gas will uniformly flow over the film precursor 350 in each tray. A person skilled in the art of vacuum design can use conventional vacuum engineering principles, or numerical simulation, or experiment, or a combination thereof, coupled with fabrication considerations, to determine the design criteria for the dimensions of the annular space 360, the diameter of each tray opening 346, the length of each tray opening, etc. For example, when using seventy-two (72) 1 mm DIA tray openings and five (5) trays, the thickness of the annular space 360 can be approximately 1.8 mm or more, such as 2.65 mm, for a container 310 having a diameter of approximately 20 cm. Additionally, for example, when using seventy-two (72) 0.4 mm DIA tray openings and five (5) trays, the thickness of the annular space 360 can be approximately 0.55 mm or more for a container 310 having a diameter of approximately 20 cm. Yet additionally, for example, when using seventy-two (72) 1.6 mm DIA tray openings and five (5) trays, the thickness of the annular space 360 can be approximately 3.5 mm or more for a container 310 having a diameter of approximately 20 cm. The number of orifices can, for example, range from approximately 2 to approximately 1000 orifices and, by way of further example, can range from approximately 50 to approximately 100 orifices. For instance, the one or more base tray openings 334 can include seventy two (72) orifices of 1 mm diameter, and the one or more stackable tray openings 346 can include seventy two (72) orifices of 1 mm diameter, wherein the width of the annular space 360 is approximately 2.65 mm.

Additionally, the evaporation exhaust space, i.e., central flow channel 318, can be designed for high flow conductance. For example, the net flow conductance from the outlet of the one or more tray openings in each tray to the outlet 322 of container 310 can exceed approximately 50 liters per second, or the flow conductance can exceed approximately 100 liters per second, or the flow conductance can exceed approximately 500 liters per second.

Figure 9:
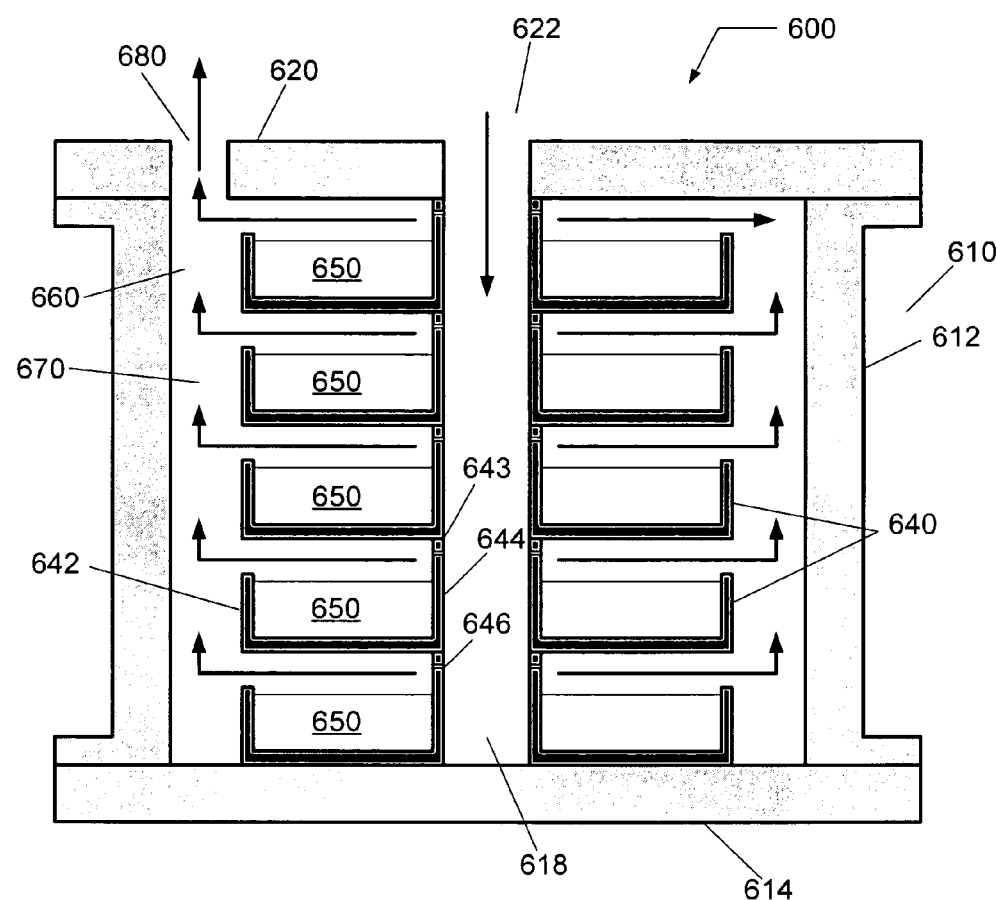
FIG. 9 presents in cross-sectional view a film precursor evaporation system according to another embodiment of the invention.

Referring now to FIG. 9, a film precursor evaporation system 600 is depicted in cross-sectional view according to another embodiment. The film precursor evaporation system 600 comprises a container 610 having an outer wall 612 and a bottom 614. Additionally, the film precursor evaporation system 600 comprises a lid 620 configured to be sealably coupled to the container 610, wherein the lid 620 includes an outlet 680 configured to be sealably coupled to a thin film deposition system, such as the one depicted in FIG. 1 or 2. The container 610 and lid 620 form a sealed environment when coupled to the thin film deposition system. The container 610 and lid 620 can, for example, be fabricated from A6061 aluminum, and may or may not include a coating applied thereon.

Furthermore, the container 610 is configured to be coupled to a heater (not shown) in order to elevate the evaporation temperature of the film precursor evaporation system 600, and to a temperature control system (not shown) in order to perform at least one of monitoring, adjusting, or controlling the evaporation temperature. When the evaporation temperature is elevated to an appropriate value as described earlier, film precursor evaporates (or sublimes) forming film precursor vapor to be transported through the vapor delivery system to the thin film deposition system. The container 610 is also sealably coupled to a carrier gas supply system (not shown), wherein the container 610 is configured to receive a carrier gas for transporting the film precursor vapor.

Figure 5C:
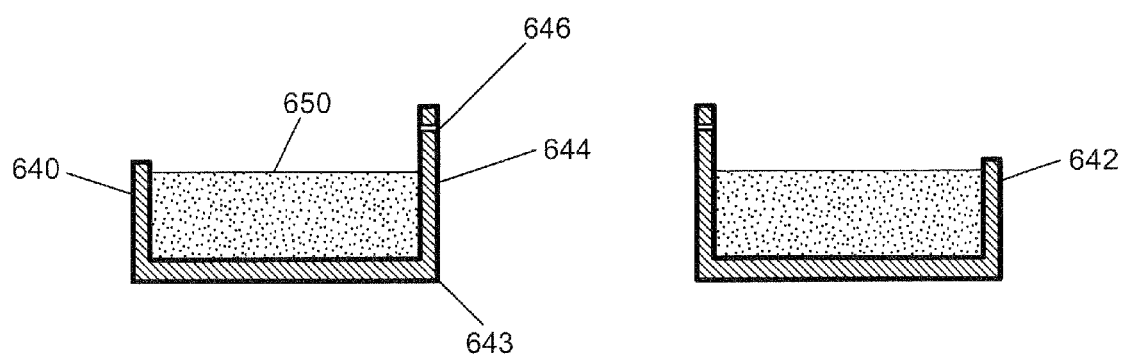
FIG. 5C presents in cross-sectional view a stackable tray illustrated in FIG. 9.
Figure 6:
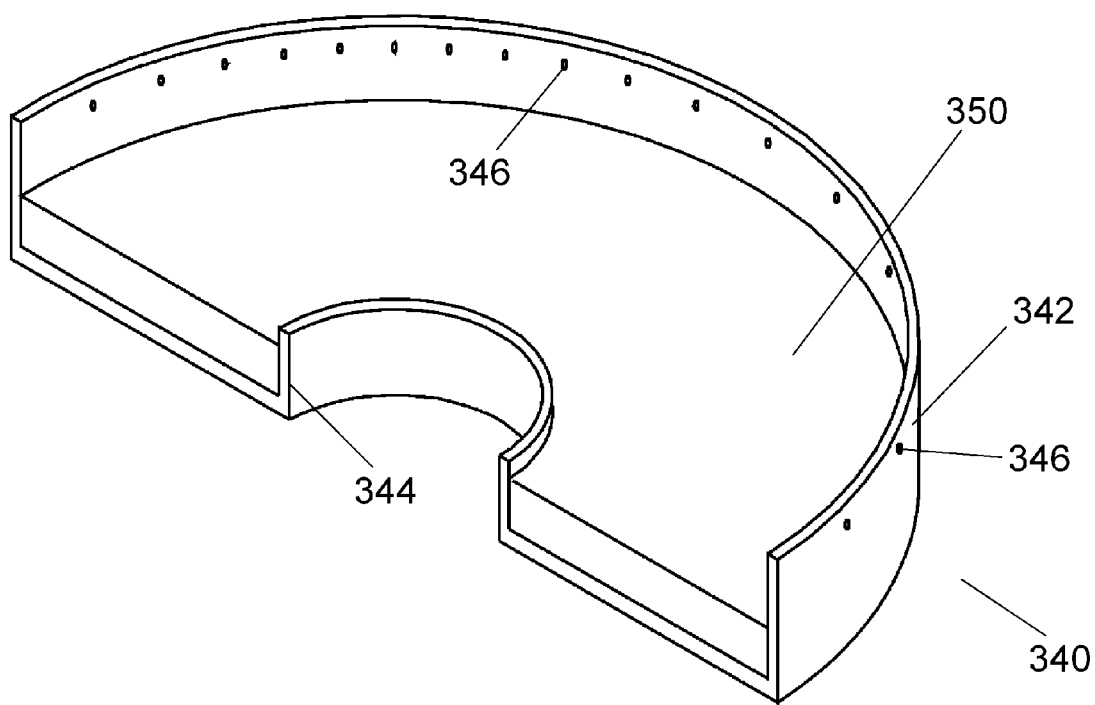
FIG. 6 presents in perspective view the tray of FIG. 5A.

Referring to FIGS. 5C and 9, the film precursor evaporation system 600 further comprises one or more stackable trays 640 configured to support film precursor 650, and configured to be positioned or stacked upon another of the stackable trays

640. Each of the stackable trays 640 comprises a tray outer wall 642 and a tray inner wall 644 configured to retain the film precursor 650 therebetween. The tray inner walls 644 define a carrier gas supply space, such as a central flow channel 618, through which carrier gas passes and flows over the film precursor 650 through tray inner walls 644. The tray inner wall 644 further includes a tray support edge 643 for supporting an additional tray 640. Thus, a second stackable tray 640 is positioned to be supported on the tray support edge 643 of an underlying first stackable tray 640, and if desired, one or more additional stackable trays may be positioned to be supported on the support edge 643 of a preceding stackable tray 640. The tray inner wall 644 of each stackable tray 640 includes one or more tray openings 646 configured to flow the carrier gas from the carrier gas supply system (not shown), through the central flow channel 618, over the film precursor 650 towards an evaporation exhaust space, such as an annular space 660 which forms a peripheral channel, of the container 610, and exhaust through the outlet 680 in the lid 620 with film precursor vapor. Consequently, tray outer walls 642 should be shorter than tray inner walls 644 to allow the carrier gas to flow substantially radially to the annular space 660. Additionally, the film precursor level in each stackable tray 640 should be at or below the height of the tray outer walls 642, and below the position of the tray openings 646.

The stackable trays 640 are depicted to be cylindrical in shape. However, the shape can vary. For instance, the shape of the trays can be rectangular, square or oval. Similarly, the inner walls 644, and thus central flow channel 618, can be differently shaped.

When one or more stackable trays 640 are stacked upon one another, a stack 670 is formed, which provides for the annular space 660 between the tray outer wall 642 of the one or more stackable trays 640 and the container outer wall 612. The container 610 can further comprise one or more spacers (not shown) configured to space the tray outer wall 642 of the one or more stackable trays 640 from the container outer wall 612, and thereby ensure equal spacing within the annular space 660. To state it another way, in one embodiment, the container 610 is configured such that the tray outer walls 642 are in vertical alignment. Additionally, the container 610 can comprise one or more thermal contact members (not shown) configured to provide mechanical contact between the inner wall of the container 610 and the outer wall of each tray, thereby assisting the conduction of thermal energy from the wall of the container 610 to each respective tray.

A sealing device, such as an O-ring, may be located between each tray and the adjacent tray or trays in order to provide a vacuum seal between one tray and the next. For example, the sealing device can be retained in a receiving groove (not shown) formed in the tray support edge 643 of inner walls 642. Therefore, once the trays are installed in the container 610, the coupling of lid 620 to container 610 can facilitate compression of each sealing device. The sealing device can, for example, include an elastomer O-ring. Additionally, the sealing device can, for example, include a Viton® O-ring.

The number of trays can range from two (2) to twenty (20) and, for example in one embodiment, the number of trays can be five (5), as shown in FIG. 9. In an exemplary embodiment, the stack 670 includes at least two stackable trays 640. The stack 670 may comprise a multi-piece stack of trays having multiple separatable and stackable trays, or it may comprise a single unitary piece having multiple trays integral with one another. Integral is understood to include a monolithic structure, such as an integrally molded structure having no discernible boundaries between trays, as well as a permanently adhesively or mechanically joined structure where there is permanent joinder between the trays. Separatable is understood to include no joinder between trays or temporary joinder, whether adhesive or mechanical.

The stackable trays 640, whether stackable or integral, are configured to support a film precursor 650. According to one embodiment, the film precursor 650 includes a solid precursor. According to another embodiment, the film precursor 650 includes a liquid precursor. According to another embodiment, the film precursor 650 includes a metal precursor. According to another embodiment, the film precursor 650 includes a solid metal precursor. According to yet another embodiment, the film precursor 650 includes a metal-carbonyl precursor. According to yet another embodiment, the film precursor 650 can be a ruthenium-carbonyl precursor, for example $Ru_3(CO)_{12}$. According to yet another embodiment of the invention, the film precursor 650 can be a rhenium carbonyl precursor, for example $Re_2(CO)_{10}$. In yet another embodiment, the film precursor 650 can be $W(CO)_6$, $Mo(CO)_6$, $Co_2(CO)_8$, $Rh_4(CO)_{12}$, $Cr(CO)_6$, or $Os_3(CO)_{12}$. Additionally, according to yet another embodiment, when depositing tantalum (Ta), the film precursor 650 can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or $Ta(EtCp)_2(CO)H$. Additionally, according to yet another embodiment, when depositing titanium (Ti), the film precursor 650 can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT). Additionally, according to yet another embodiment, when depositing ruthenium (Ru), the film precursor 650 can include $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$.

As described above, the film precursor 650 can include a solid precursor. The solid precursor can take the form of a solid powder, or it may take the form of one or more solid tablets. For example, the one or more solid tablets can be prepared by a number of processes, including a sintering process, a stamping process, a dipping process, or a spin-on process, or any combination thereof. Additionally, the solid precursor in solid tablet form may or may not adhere to the stackable tray 640. For example, a refractory metal powder may be sintered in a sintering furnace configured for both vacuum and inert gas atmospheres, and temperature up to 2000° C. and 2500° C. Alternatively, for example, a refractory metal powder can be dispersed in a fluid medium, dispensed on a tray, and distributed evenly over the tray surfaces using a spin coating process. The refractory metal spin coat may then be thermally cured.

As described earlier, carrier gas is supplied to the container 610 from a carrier gas supply system (not shown). As shown in FIG. 9, the carrier gas may be coupled to the container 610 through the lid 620 via a gas supply line (not shown) sealably coupled to the lid 620. The gas supply line feeds the central flow channel 618.

Referring again to FIGS. 5C and 9, the inner diameter of the container outer wall 612 can, for example, range from approximately 10 cm to approximately 100 cm and, for example, can range from approximately 15 cm to approximately 40 cm. For instance, the inner diameter of outer wall 612 can be 20 cm. The diameter of the outlet 622 and the inner diameter of the inner walls 644 of the stackable trays 640 can, for example, range from approximately 1 cm to 30 cm and, additionally, for example, the outlet diameter and inner wall diameter can range from approximately 5 to approximately 20 cm. For instance, the outlet diameter can be 10 cm. Additionally, the outer diameter of each of the stackable trays 640 can range from approximately 75% to approximately 99% of the inner diameter of the outer wall 612 of container 610 and, for example, the tray diameter can range from approximately 85% to 99% of the inner diameter of the outer wall 612 of container 610. For instance, the tray diameter can be 19.75 cm. Additionally, the height of the tray inner wall 644 of each of the stackable trays 640 can range from approximately 5 mm to approximately 50 mm and, for example, the height of each is approximately 30 mm. In addition, the height of each outer wall 642 can range from approximately 10% to approximately 90% of the height of the tray inner wall 644. For example, the height of each outer wall can range from approximately 2 mm to approximately 45 mm and, for example, can range from approximately 10 mm to approximately 20 mm. For example, the height of each inner wall is approximately 12 mm.

Referring yet again to FIGS. 5C and 9, the one or more tray openings 646 can include one or more slots. Alternatively, the one or more tray openings 646 can include one or more orifices. The diameter of each orifice can, for example, range from approximately 0.4 mm to approximately 2 mm. For example, the diameter of each orifice can be approximately 1 mm. In one embodiment, the orifice diameter and the diameter of the central flow channel 618 are chosen such that the conductance through central flow channel 618 is sufficiently larger than the net conductance of the orifices in order to maintain substantially uniform distribution of the carrier gas throughout the central flow channel 618. The number of orifices can, for example, range from approximately 2 to approximately 1000 orifices and, by way of further example, can range from approximately 50 to approximately 100 orifices. For instance, the one or more tray openings 646 can include seventy two (72) orifices of 1 mm diameter, wherein the diameter of the central flow channel 618 is approximately 10 to 30 mm.

Additionally, the evaporation exhaust space, i.e., annular space 660, can be designed for high flow conductance. For example, the net flow conductance from the outlet of the one or more tray openings in each tray to the outlet 680 of container 610 can exceed approximately 50 liters per second, or the flow conductance can exceed approximately 100 liters per second, or the flow conductance can exceed approximately 500 liters per second.

The film precursor evaporation systems 300 or 300', or 400, 500 or 600 may be used as either the film precursor evaporation system 50 in FIG. 1, or the film precursor evaporation system 150 in FIG. 2. Alternatively, system 300 or 300', or 400, 500 or 600 may be used in any film deposition system suitable for depositing a thin film on a substrate from precursor vapor. For example, the film deposition system may include a thermal chemical vapor deposition (CVD) system, a plasma enhanced CVD (PECVD) system, an atomic layer deposition (ALD) system, or a plasma enhanced ALD (PEALD) system.

Figure 10:
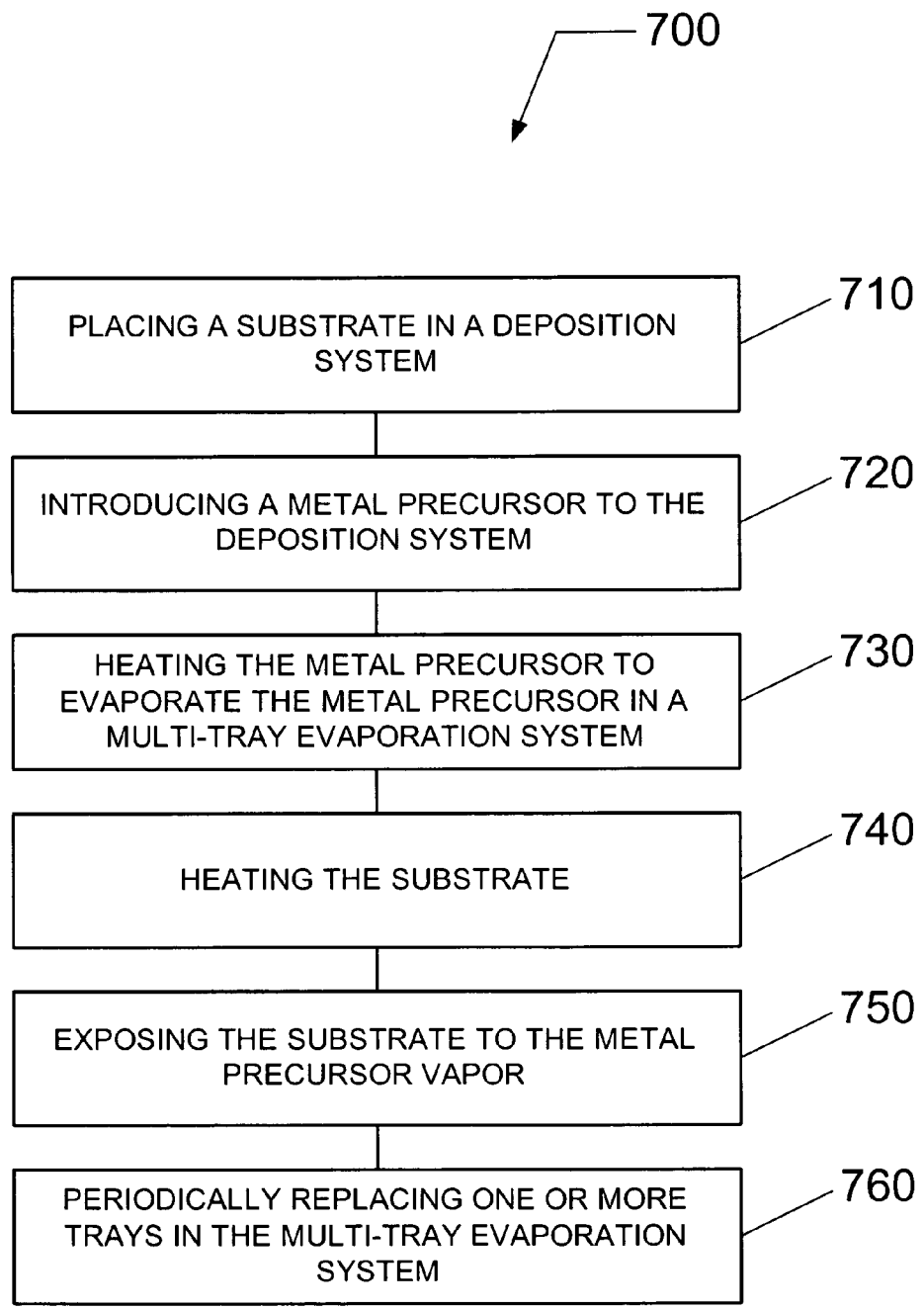
FIG. 10 illustrates a method of operating a film precursor evaporation system of the invention.

Referring now to FIG. 10, a method of depositing a thin film on a substrate is described. A flow chart 700 is used to illustrate the steps in depositing the thin film in a deposition system of the present invention. The thin film deposition begins in 710 with placing a substrate in the deposition system in succession for forming the thin film on the substrate. For example, the deposition system can include any one of the depositions systems described above in FIGS. 1 and 2. The deposition system can include a process chamber for facilitating the deposition process, and a substrate holder coupled to the process chamber and configured to support the substrate. Then, in 720, a film precursor is introduced to the deposition system. For instance, the film precursor is introduced to a film precursor evaporation system coupled to the process chamber via a precursor vapor delivery system. Additionally, for instance, the precursor vapor delivery system can be heated.

In 730, the film precursor is heated to form a film precursor vapor. The film precursor vapor can then be transported to the process chamber through the precursor vapor delivery system. In 740, the substrate is heated to a substrate temperature sufficient to decompose the film precursor vapor, and, in 750, the substrate is exposed to the film precursor vapor. Steps 710 to 750 may be repeated successively a desired number of times to deposit a metal film on a desired number of substrates.

Following the deposition of the thin film on one or more substrates, the stack of trays 370 or 370', or 670, or one or more of the base or upper trays 330, 340, or one or more of the stackable trays 640, can be periodically replaced in 760 in order to replenish the level of film precursor 350, 650 in each tray.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A replaceable stackable tray configured to support a horizontal layer of a film precursor and to be stacked with one or more additional replaceable stackable trays in a container of a film precursor evaporation system, where the container has an outer container wall, a container bottom, and a removable container lid configured to be sealably coupled to said outer container wall, said lid having a container outlet sealably connectable to an inlet of a thin film deposition system, said tray comprising:

a generally horizontal annular tray bottom having a generally circular outer rim and a generally circular inner rim surrounding a central opening;

a generally vertical cylindrical inner tray wall having an inner top edge and extending vertically upward from said inner rim;

a generally vertical cylindrical outer tray wall having an outer top edge and extending vertically upward from said inner rim;

the tray walls being configured to retain a film precursor between the inner and outer tray walls in a horizontally disposed layer supported on and distributed over the tray bottom;

said inner and outer tray walls being of different heights such that one tray wall is a lower wall and the other tray wall is a higher wall that is a stacking wall, the top edge of which is a tray supporting edge that is configured to support another stackable tray on a corresponding inner or outer circular rim of an annular tray bottom thereof;

said stacking wall having a plurality of angularly-spaced gas-flow openings formed therein; and the tray, when stacked with one or more other of said trays, forming a plurality of parallel, annular, vertically-spaced, generally horizontal radial flow paths that each extends from a carrier gas supply, through said gas-flow openings of a respective one of the stacked trays, then in a generally horizontal, radial direction over an upper surface of a film precursor supported on said tray bottom of said respective one of the stacked trays, where film precursor evaporates into the carrier gas and from where the carrier gas, along with the evaporated film precursor vapor, flows over the top edge of the lower tray wall of said respective one of the trays to join gas flowing from other paths of the plurality toward and through the outlet in the container lid;

whereby carrier gas flowing from the carrier gas supply divides in separate parallel annular, generally horizontal radial paths to flow over precursor supported in one and only one respective tray of a stacked plurality, without flowing over precursor supported in any other tray of the stacked plurality.

2. The replaceable stackable tray of claim 1, wherein:

said inner tray wall is the higher wall and is the stacking wall, the top edge of which is the tray supporting edge and is configured to support another stackable tray on an inner circular rim of the annular tray bottom thereof;

said inner tray wall having the plurality of angularly-spaced gas-flow openings formed therein; and the tray, when stacked with one or more other of said trays, forms a plurality of parallel, annular, vertically-spaced, generally horizontal, radially-outward flow paths that each extends from a carrier gas supply, through said gas-flow openings of a respective one of the stacked trays, then in a generally horizontal, radially outward direction over an upper surface of a film precursor supported on the tray bottom of said respective one of the stacked trays, where film precursor evaporates into the carrier gas and from where the carrier gas, along with the evaporated film precursor vapor, flows over the top edge of the outer tray wall of said respective one of the trays to join gas flowing from other paths of the plurality toward and through the outlet in the container lid;

whereby carrier gas flowing from the carrier gas supply divides in separate parallel annular, generally horizontal radially outward paths to flow radially outwardly over the precursor supported in one and only one respective tray of a stacked plurality, without flowing over precursor supported in any other tray of the stacked plurality.

3. A replaceable film precursor support assembly comprising the tray of claim 2, and further comprising:

a film precursor supported in said tray between said inner tray wall and said outer tray wall on said annular tray bottom.

4. The replaceable stackable tray of claim 1, wherein:

said outer tray wall is the higher wall and is the stacking wall, the top edge of which is the tray supporting edge and is configured to support another stackable tray on an outer circular rim of the annular tray bottom thereof;

said outer tray wall having the plurality of angularly-spaced gas-flow openings formed therein; and the tray, when stacked with one or more other of said trays, forms a plurality of parallel, annular, vertically-spaced, generally horizontal, radially-inward flow paths that each extends from a carrier gas supply, through said gas-flow openings of a respective one of the stacked trays, then in a generally horizontal, radially inward direction over an upper surface of a film precursor supported on the tray bottom of said respective one of the stacked trays, where film precursor evaporates into the carrier gas and from where the carrier gas, along with the evaporated film precursor vapor, flows over the top edge of the inner tray wall of said respective one of the trays to join gas flowing from other paths of the plurality toward and through the outlet in the container lid;

whereby carrier gas flowing from the carrier gas supply divides in separate parallel annular, generally horizontal radially inward paths to flow radially inwardly over the precursor supported in one and only one respective tray of a stacked plurality, without flowing over precursor supported in any other tray of the stacked plurality.

5. A replaceable film precursor support assembly comprising the tray of claim 1, and further comprising:

a metal precursor supported in the tray.

6. A replaceable film precursor support assembly comprising the tray of claim 1, and further comprising:

a solid precursor supported in the tray.

7. A replaceable film precursor support assembly comprising the tray of claim 1, and further comprising:

a solid powder precursor supported in the tray.

8. A replaceable film precursor support assembly comprising the tray of claim 1, and further comprising:

a solid precursor that includes at least one solid precursor tablet.

9. A replaceable film precursor support assembly comprising the tray of claim 1, and further comprising:

a metal-carbonyl film precursor supported in the tray.

10. The replaceable film precursor support assembly of claim 9, wherein said metal-carbonyl film precursor includes $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$.

11. A film precursor evaporation system comprising:

a container having an outer container wall, a container bottom, and a removable container lid sealably coupled to said outer container wall, said lid having an outlet sealably connectable to an inlet of a thin film deposition system; and a plurality of replaceable stackable trays of claim 1 stacked within the container.

12. A film precursor evaporation system configured to be coupled to a thin film deposition system and comprising a plurality of trays of claim 1, and further comprising:

a container having an outer wall, a top having an opening therein, and a container bottom, said container being configured to be coupled to a heater and heated to an elevated temperature;

a container lid sealably coupled to the top of said container and closing the opening, said lid having an outlet configured to be sealably coupled to a thin film deposition system;

a tray stack comprising said plurality of trays including a first tray supported in said container either directly or indirectly on said container bottom, and a plurality of annular additional trays, each stacked, one on said first tray, with each additional tray in excess of one being stacked on an additional tray;

the inner tray walls defining a central cylindrical flow channel in said container extending vertically from said first tray through the open center of each of the one or more additional trays, and said outer tray walls and said outer wall of said container having an annular space therebetween defining a vertical, annular peripheral flow channel in said container, one of said central flow channel and said peripheral flow channel being a supply channel configured to be coupled to a carrier gas supply system to supply a carrier gas to said one of said channels and the other of said central flow channel and said peripheral flow channel being an exhaust channel configured to be coupled to said outlet in said lid;

a plurality of the trays of the tray stack forming said plurality of parallel, annular, vertically-spaced, generally horizontal radial flow paths.

13. The system of claim 12 wherein:

said central flow channel is said supply channel and said peripheral channel is said exhaust channel; and said inner walls being said stacking walls having said one or more orifices therein and coupled to said supply channel and configured to flow the carrier gas from said central channel, over said film precursor towards said peripheral channel to exhaust said carrier gas through said outlet in said lid with film precursor vapor.

14. The system of claim 12 wherein:
said peripheral flow channel is said supply channel and said central channel is said exhaust channel; and
said outer walls being said stacking walls having said one or more orifices therein and coupled to said supply channel and configured to flow the carrier gas from said peripheral flow channel, over said film precursor towards said central flow channel to exhaust said carrier gas through said outlet in said lid with film precursor vapor.

15. A thin film deposition system comprising the evaporation system of claim 12 and further comprising:
a heater coupled to said container and configured to heat the container to an elevated temperature;
a deposition chamber having an inlet coupled to the container outlet.

16. The film precursor evaporation system of claim 12 further comprising a solid metal precursor in either solid powder or solid tablet form supported in each of said trays.

17. The film precursor evaporation system of claim 12 further comprising one or more of $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, $Ta(EtCp)_2(CO)H$, $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), $Ti[N(C_2H_5)_2]_4$ (TDEAT), $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$, or any combination of two or more thereof, supported in each of said trays.

18. The film precursor evaporation system of claim 12 wherein said trays are separatable and stackable trays configured to be stacked in said container to form a multi-piece multi-tray stack.

19. A thin film deposition system for forming a thin film on a substrate, comprising the film precursor evaporation system of claim 12, and further comprising:
a process chamber having a substrate holder configured to support said substrate and heat said substrate, a vapor distribution system configured to introduce film precursor vapor above said substrate, and a pumping system configured to evacuate said process chamber; and
said outlet being coupled to said vapor distribution system.

20. A deposition system for forming a thin film on a substrate comprising the film precursor evaporation system of claim 12 and further comprising:
a process chamber having a substrate holder configured to support said substrate and heat said substrate, a vapor distribution system configured to introduce film precursor vapor above said substrate, and a pumping system configured to evacuate said process chamber; and
a vapor delivery system having a first end sealably coupled to said outlet of said film precursor evaporation system and a second end sealably coupled to an inlet of said vapor distribution system of said process chamber.

21. The deposition system of claim 20, wherein said film precursor is a solid metal precursor.

22. The deposition system of claim 20, wherein said film precursor includes one or more of $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, $Ta(EtCp)_2(CO)H$, $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), $Ti[N(C_2H_5)_2]_4$ (TDEAT), $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$, or any combination of two or more thereof.

23. A replaceable film precursor support assembly comprising the tray of claim 1, and further comprising:
a film precursor supported in said tray between said inner tray wall and said outer tray wall on said annular tray bottom.

24. A film precursor evaporation system configured to be coupled to a thin film deposition system, comprising
a container having an outlet configured to be sealably connected to a thin film deposition system and an inlet configured to be sealably connected to a carrier gas supply system;
a plurality of trays configured to be arranged in a vertical stack within said container, each tray being configured to support and evaporate a precursor material to form a precursor vapor,
a common carrier gas supply space within said container configured to receive a flow of said carrier gas from said inlet and to deliver to each of said trays a respective portion of said flow of said carrier gas received from said inlet;
a common exhaust space within said container configured to receive and combine said portions of said flow of carrier gas containing precursor vapor evaporated in each of said respective trays from each of said respective trays, and to deliver said carrier gas containing said precursor to said outlet;
each of said trays having a wall between said common carrier gas supply space and said common exhaust space when the trays are arranged in the vertical stack in the container, said walls each having one or more orifices therein configured to pass the respective portions of said flow of said carrier gas from said common carrier gas supply space over the precursor material supported in the respective tray and to said common exhaust space; and
said orifices being configured such that the flow conductance through said common carrier gas supply space from said inlet to said one or more orifices in each of said plurality of trays is sufficiently larger than the net flow conductance through said one or more orifices in each of said plurality of trays in order to make the respective portions of said flow substantially equal and thereby permit a substantially equal distribution of said carrier gas over said precursor material in each of said trays.

25. The film precursor evaporation system of claim 24, wherein the trays include a plurality of annular trays having a central opening, the common carrier gas supply space includes the central opening of each tray, the common exhaust space is an annular vertical space surrounding each of the trays, and said portions of said flow of said carrier gas move in a generally radially outward direction in each of said trays.

26. The film precursor evaporation system of claim 24, wherein the trays include a plurality of annular trays having a central opening, the common exhaust space includes the central opening of each tray, the common carrier gas supply space is an annular vertical space surrounding each of the trays, and said portions of said flow of said carrier gas move in a generally radially inward direction in each of said trays.

* * * * *

UNITED STATES PATENT AND TRADEMARK OFFICE
CERTIFICATE OF CORRECTION

| | | |
|---|---|---|
| PATENT NO. | : 7,708,835 B2 | Page 1 of 1 |
| APPLICATION NO. | : 11/351546 | |
| DATED | : May 4, 2010 | |
| INVENTOR(S) | : Kenji Suzuki et al. | |

It is certified that error appears in the above-identified patent and that said Letters Patent is hereby corrected as shown below:

Column 18

Line 46, "inner" should be --outer--.

Signed and Sealed this
Twenty-sixth Day of July, 2011

David J. Kappos
*Director of the United States Patent and Trademark Office*